(12) United States Patent
Engesser

(10) Patent No.: US 7,172,674 B2
(45) Date of Patent: Feb. 6, 2007

(54) DEVICE FOR LIQUID TREATMENT OF WAFER-SHAPED ARTICLES

(75) Inventor: Philipp Engesser, Lindau (DE)

(73) Assignee: SEZ AG, Villach (AT)

( * ) Notice: Subject to any disclaimer, the term of this patent is extended or adjusted under 35 U.S.C. 154(b) by 131 days.

(21) Appl. No.: 09/984,707

(22) Filed: Oct. 31, 2001

(65) Prior Publication Data
US 2002/0050244 A1 May 2, 2002

(30) Foreign Application Priority Data
Oct. 31, 2000 (EP) .................................. 00123714

(51) Int. Cl.
B05C 13/00 (2006.01)
B03B 3/00 (2006.01)
H01L 21/00 (2006.01)

(52) U.S. Cl. .................... 156/345.19; 156/345.11; 156/345.23; 156/345.3; 156/345.55; 134/99.1; 134/140; 134/149; 134/153; 134/157; 118/52; 118/300; 118/301; 118/504

(58) Field of Classification Search ............ 156/345.11, 156/345.23, 345.3, 345.51–345.54, 345.55, 156/157, 113, 902, 201, 102.1; 134/113, 134/99.1, 137, 140, 149, 153, 157, 902, 201, 134/102.1; 118/500, 504, 52, 300, 301, 53; 113/902
See application file for complete search history.

(56) References Cited

U.S. PATENT DOCUMENTS

| | | | |
|---|---|---|---|
| 4,593,168 A * | 6/1986 | Amada ........................ 219/753 |
| 4,838,289 A | 6/1989 | Kottman et al. |
| 4,903,717 A | 2/1990 | Sumnitsch ................... 134/99 |
| 5,261,965 A | 11/1993 | Moslehi ........................ 134/1 |
| 5,608,943 A | 3/1997 | Konishi et al. |
| 5,689,749 A * | 11/1997 | Tanaka et al. .............. 396/611 |
| 5,769,945 A * | 6/1998 | Davis et al. ................... 118/52 |
| 5,855,687 A * | 1/1999 | DuBois et al. .............. 118/729 |
| 5,916,366 A * | 6/1999 | Ueyama et al. ................ 118/52 |
| 5,974,682 A * | 11/1999 | Akimoto ......................... 34/66 |
| 5,985,039 A * | 11/1999 | Yonemizu et al. ............. 134/2 |
| 6,056,825 A * | 5/2000 | Sumnitsch ................... 118/730 |
| 6,183,565 B1 * | 2/2001 | Granneman et al. ........ 118/725 |
| 6,221,157 B1 * | 4/2001 | Davis et al. ................... 118/52 |
| 6,435,200 B1 * | 8/2002 | Langen ....................... 134/99.1 |
| 6,558,478 B1 * | 5/2003 | Katakabe et al. ............. 134/33 |
| 6,649,077 B2 * | 11/2003 | Tsai et al. ...................... 216/92 |
| 6,689,418 B2 * | 2/2004 | Olgado et al. .............. 427/240 |
| 6,708,701 B2 * | 3/2004 | Emami ........................ 134/148 |
| 6,786,996 B2 * | 9/2004 | Emami .................... 156/345.1 |
| 6,858,092 B2 * | 2/2005 | Langen .......................... 134/33 |
| 7,007,702 B2 * | 3/2006 | Langen ....................... 134/99.1 |
| 2002/0050244 A1 * | 5/2002 | Engesser ...................... 118/20 |

(Continued)

FOREIGN PATENT DOCUMENTS

AT 32260/68 7/1969

(Continued)

Primary Examiner—Jeffrie R. Lund
(74) Attorney, Agent, or Firm—Young & Thompson

(57) ABSTRACT

A device for liquid treatment of a defined area of a wafer-shaped article, especially of a wafer, in which a mask is kept at a defined short distance to the wafer-shaped article such that liquid can be retained between the mask and the defined area of the wafer-shaped article by capillary forces.

32 Claims, 2 Drawing Sheets

U.S. PATENT DOCUMENTS

Figure 4:
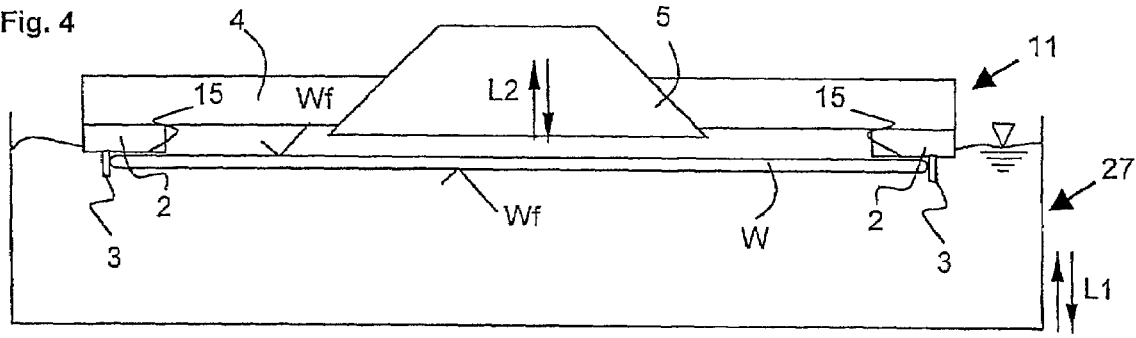

2003/0024557 A1* 2/2003 Olgado et al. .............. 134/902
2006/0144429 A1* 7/2006 Langen ..................... 134/95.3

FOREIGN PATENT DOCUMENTS

| | | |
|---|---|---|
| DE | 43 05 772 | 9/1994 |
| DE | 198 05 110 | 8/1998 |
| DK | 4202194 A1 * | 7/1993 |
| EP | 0 316 296 | 5/1989 |
| EP | 0 444 714 | 9/1991 |
| EP | 0 810 641 | 12/1997 |
| EP | 0 844 646 | 5/1998 |
| EP | 1 020 894 | 7/2000 |
| EP | 1 052 682 | 11/2000 |
| JP | 59124824 | 7/1984 |
| JP | 9181026 | 7/1997 |
| WO | WO 94/13454 | 6/1994 |

* cited by examiner

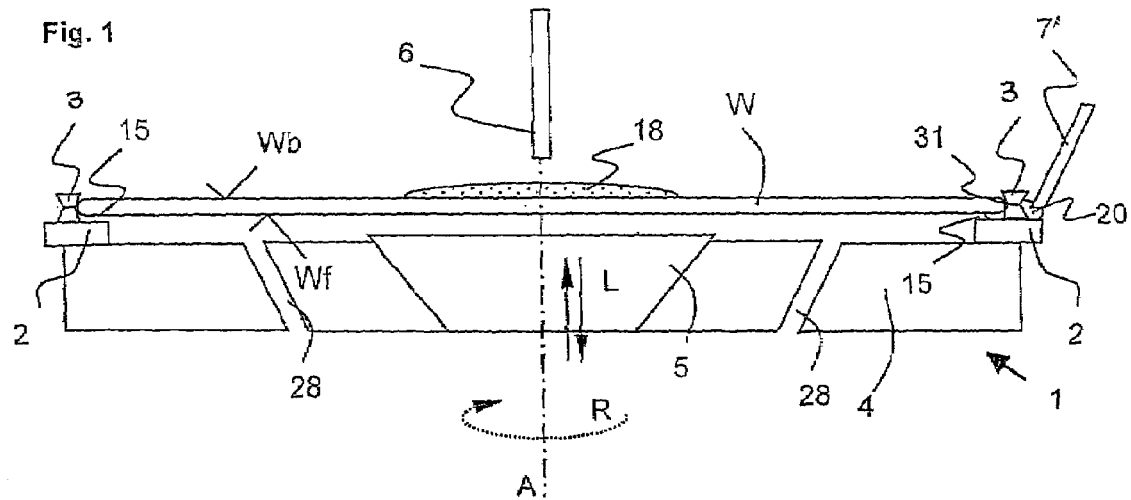
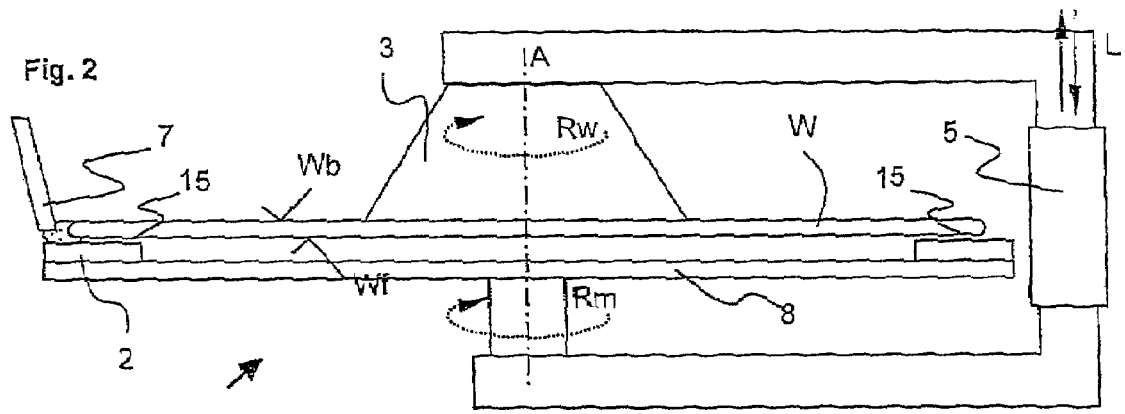
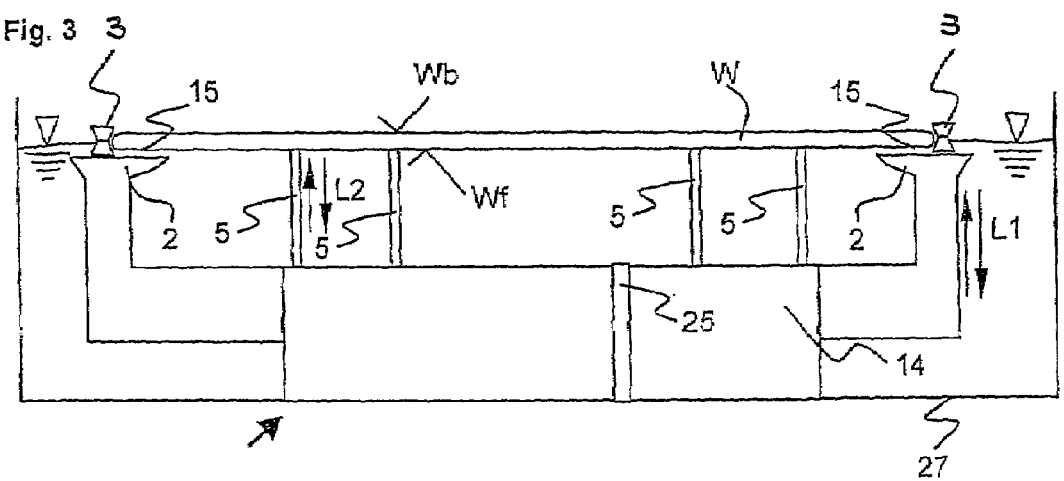

DEVICE FOR LIQUID TREATMENT OF WAFER-SHAPED ARTICLES

BACKGROUND OF THE INVENTION

The invention relates to a device and a process for liquid treatment of a defined area of the main surface of a wafer-shaped article, especially a wafer.

The reason for treatment of a defined section of a wafer-shaped article, i.e. the section near the edge, especially of a wafer, will be described below.

A wafer, for example a silicon wafer, can have for example a coating of silicon dioxide on all sides. For subsequent processes (when for example a gold layer or a layer of polysilicon (polycrystalline silicon) is to be applied) it can be necessary to remove the existing coating from the wafer at least in the edge area of the main surface, but also optionally in the area of its peripheral surface and/or the second main surface. This takes place by etching processes which can be divided mainly into dry etching processes and wet etching processes. It can also be desirable to remove a metal (for example, copper) which was applied galvanically beforehand from certain areas of the main surface of the semiconductor substrate. In this case, this area can be either an annular section near the edge, or exactly the area of the front main surface (main surface on which the structures are located=device side), in which there are no structures, i.e. the chip-free zone.

Another application is the cleaning of wafers. Here it can be necessary to clean the wafer at least in the edge area of the main surface, but optionally also in the area of its peripheral surface and/or the second main surface, i.e. to remove particles and/or other contamination. This is done by wet cleaning processes.

Another liquid treatment is the application of layers, for example galvanic application of metals (electroplating). This can be done with or without current, in the latter case its being "Electroless Electroplating".

The invention is aimed at wet etching, wet cleaning or wet chemical application of layers (combined under the concept of liquid treatment). The surface section of the wafer to be treated is wetted with the treatment liquid and the layer to be removed or the impurities are removed or a layer is built up in this surface section.

During liquid treatment the wafer-shaped article can be either stationary or can rotate (for example, around an axis).

To prevent the treatment liquid from reaching the surface not to be treated in an uncontrolled manner, EP 0 316 296 B1 suggests a carrier (chuck) which flushes the surface, which faces the carrier and which is not to be treated, with a gas. In doing so the gas emerges between the edge of the wafer and the carrier.

JP 09-181026 A describes a carrier for semiconductor wafers which outside an annular nozzle has a special shape, for example an annular step which falls off to the outside, or a bevel of its edge. An intake opening is also proposed. The flow velocity in the edge area will be influenced (reduced) by this shaping or by the intake opening. This is intended to be used to allow the treatment liquid applied from the top to flow beyond the edge of the wafer onto the side facing the chuck and to treat an edge area there.

Regardless of whether a means for accommodating the wafer-shaped article (carrier or chuck) as claimed in EP 0 316 296 B1 or JP 09-181026 A (English abstract) is used, on the main surface facing the carrier an edge area of 1.5 mm (measured from the outer edge of the wafer) at maximum is treated. Afterwards, the liquid flows back in the direction of the wafer edge and is flung off by it. This treated edge area is not intentionally defined in either of the two cases, rather it is a random result, since the size of the edge area depends largely on a plurality of parameters which mutually influence one another to some extent, such as the surface composition (roughness, type and thickness of the adsorption layers), temperature, pressure, humidity, etc.

U.S. Pat. No. 4,838,289 A discloses a system for etching the edge of a wafer, in which a nozzle is pointed against the area of the wafer surface to be treated while the wafer rotates. The defect of this system is that the area to be treated is not exactly defined and also liquid can reach the area which is not to be treated.

SUMMARY OF THE INVENTION

Accordingly, the object of the invention is to enable treatment of a defined section with a liquid on the surface of a wafer-shaped article, and it will also be possible among others to treat an edge area of more than 2 mm (measured from the outer edge of the wafer-shaped article). This defined section can also be an inner area of the surface of the wafer-shaped article, i.e. the area which does not extend to the edge of the wafer-shaped article. If here too one area at a time is bordered by a circular line to the outside and/or inside, this is still unnecessary; the area to be treated can also be bordered for example by a polygon. This boundary line can, if the wafer-shaped article is a wafer, correspond to the area of the surface on which the chips are located ("device area"). Accordingly either the inner chip area or the outer chip-free area can be treated.

Accordingly, in its most general embodiment the invention proposes a device for liquid treatment of a defined section of the wafer-shaped article, especially a wafer, consisting of holding means for holding the wafer-shaped article, a mask which in shape and size corresponds to the area of the defined section which is to be treated with liquid, and spacer means which keep the mask and the wafer-shaped article at a defined small distance to one another such that liquid can be retained between the mask and the defined area of the wafer-shaped article by capillary forces.

Holding means can be among others vacuum grippers, gripping means which touch the wafer-shaped article on its peripheral-side edge, or a so-called Bernoulli chuck.

The mask is made such that, when a wafer-shaped article (wafer) is located on the carrier, the mask does not touch the wafer-shaped article (wafer), i.e. a gap remains between the wafer and the mask. The mask projected perpendicularly onto the main surface of the wafer indicates the area of the wafer which is treated with liquid. The material of the surface of the mask which is facing the wafer-shaped article should be chosen such that it is wetted by the liquid so well that liquid is kept in the gap between the wafer-shaped article and the mask by capillary force. The sum of the two wetting angles of the liquid on the one hand against the wafer-shaped article and on the other hand against the mask should be less than 180°, preferably less than 150°. In the preselected mask surface this can of course be achieved also by additives which are added to the liquid (wetting agents).

One advantage of the device as claimed in the invention is that the article to be treated is wetted exactly in the area to be treated by the treatment liquid, without this area being touched by a solid. At the same time the liquid droplets are prevented from reaching areas which are not to be treated or should not be treated.

In one advantageous embodiment the mask has the shape of a ring. In this case the ring can have an inside diameter which is less than the outside diameter of the wafer-shaped article, and an outside diameter which is at least the same size as the outside diameter of the wafer-shaped article. This can be necessary when the surface to be treated likewise has the shape of a ring, as is the case for example when removing a layer from a defined edge area of a semiconductor wafer.

It is advantageous if the spacer means keep the mask and the wafer-shaped article at a distance of 0.05 to 1 mm to one another. When using thin liquid media such as water, solvents or various acids in an aqueous solution, the liquid is easily prevented from running out of the capillary area between the mask and the wafer-shaped article.

In one embodiment the spacer means consists of gripper elements which are in direct contact with the wafer-shaped article and are joined directly or indirectly to the mask. This can take place for example by an outside rod (indirectly) or by for example pins located on the peripheral side (directly).

In another embodiment the mask and holding means are stationary relative to one another with respect to rotation around an axis which is perpendicular to the mask. The mask and the holding means therefore both do not rotate or, for example the holding means rotates, and with it the wafer-shaped article, thus the mask rotates at the same time with the same speed. The lack of relative motion of the mask to the surface of the wafer-shaped article is advantageous when the liquid held in the capillary area between the mask and the wafer-shaped article, while it is kept in this area, should experience as little motion in itself as possible. This prevents reaching into the area which is not to be treated by the liquid.

The spacer means can consist of a gas feed means which is joined directly or indirectly to the mask and is pointed against the wafer-shaped article, by which the wafer-shaped article can be kept on a gas cushion. This gas feed means can be for example one or more nozzles located perpendicular or slantwise to the surface of the wafer-shaped article or an annular nozzle. By choosing the pressure and the gas volume flow, for a stipulated shape, size and arrangement of the gas feed means the distance between the gas feed means and the wafer-shaped article and thus the distance between the mask and wafer-shaped article can be adjusted exactly and reproducibly.

Furthermore, the device of the invention can have in one embodiment distance changing means which can increase the distance between the mask and the wafer-shaped article to one another such that liquid which is located between the mask and wafer-shaped article is no longer held by capillary forces. Here it can be a movement mechanism which can move the holding means perpendicular to the surface of the wafer-shaped article or a movement mechanism which can move the mask accordingly. But the wafer-shaped article can also be directly moved accordingly. A distance changing means can be for example an additional gripper (for example, spoon) or there are pins (lifting pins) which lift the wafer-shaped article. The distance changing means can also be a gas feed means with an operating state which can be changed such that the wafer-shaped article is raised or lowered.

The mask and the wafer-shaped article are moved apart from one another by one such distance spacing means such that the liquid which is found in the area in between can be removed again. It is advantageous if the distance changing means can increase the distance by at least 0.2 mm, preferably at least 0.5 mm.

It is advantageous if the distance changing means are made such that they can change the distance between the mask and the wafer-shaped article during or immediately after liquid treatment. This is possible for example in the case of the gas feed means as a distance changing means.

In one embodiment, the distance changing means and spacer means are made such that elements of the spacer means are at the same time elements of the distance changing means. If the spacer means has pins with the corresponding notches which touch the wafer-shaped article on the peripheral side and thus keep it at a defined distance to the mask, these pins are at the same time an element of the distance changing means when they can be moved perpendicularly to the surface of the wafer-shaped article.

In one embodiment, essentially perpendicular to the main surface of the wafer-shaped article, there are guide elements which border the position of the wafer-shaped article on the peripheral side. In this way the position of the wafer-shaped article is fixed against the mask with respect to displacement. The distance of the guide elements to the center of a wafer-shaped article can be variable.

This distance can also be reduced to such a small amount that the guide elements can secure the wafer-shaped article and they are in this respect also an element of the holding means. The holding means can also consist of guide elements and also a gas feed means.

A device in which the distance changing means consists of a gas feed means which is connected directly or indirectly to the mask and is pointed against the main surface of the article, by which the wafer-shaped article can be held on a gas cushion. Here the gas feed means need not necessarily be spacer means at the same time, since the spacer means can be a simple mechanical support (for example, pins, spacer ring) and the gas feed means routes gas only when the wafer-shaped article is lifted.

But the spacer means and the distance changing means can also be essentially the same gas feed means, means being provided by which the gas feed means can be shifted into at least two different operating states. By means of these at least two different operating states, at least two different distances between the wafer-shaped article and the mask can be set. These means are for example means which can change the pressure and/or the volumetric flow of the gas supplied to the gas feed means. These means are for example reducing valves or valves which open and close the additional nozzles of the gas feed means. At a higher volumetric flow the wafer-shaped article then assumes a greater distance to the mask than at a lower volumetric flow. Other means can change the size, shape and/or the alignment of the gas feed means. If for example movable nozzles are used, the wafer-shaped article is lifted the more dramatically, the larger the angle (0° to 90°) is chosen to be between the nozzle alignment and surface of the wafer-shaped article against which the nozzle is pointed.

Spacer means and distance changing means can also be two gas feed means which can be triggered separately from one another.

In one embodiment the holding means can be caused to rotate, by which the wafer-shaped article rotates. This is, even if not necessary, advantageous since the treatment liquid can be flung off both from the carrier and also from the wafer edge.

This gap between the mask and the wafer-shaped article in the embodiment is 0.05 to 1 mm, advantageously 0.1 to 0.5 mm. Thus, between the wafer and the gas guide device a type of capillary forms by which the liquid which has flowed around the wafer edge is sucked. The inside diameter of the surface which faces the gas guide device and which is wetted by the liquid is less than the inside diameter of the annular surface of the gas guide device.

It is advantageous when the surface of the gas guide device facing the wafer-shaped article is parallel to the main surfaces of the wafer-shaped article. The gap between the wafer-shaped article (wafer) and the gas guide device is thus the same size in the entire edge area.

One embodiment calls for the carrier to be able to be rotated. This is, even if not necessary, advantageous since the treatment liquid can be flung off both from the carrier and also from the wafer edge. If the carrier is not in rotation during liquid treatment, the liquid can be blown off by a gas stream (from a gas feed means).

In addition, the device can have a liquid line which is pointed at the surface of the wafer-shaped article facing the mask. In this way the surface with a defined first area which has not been treated with a first liquid can also be treated with a second liquid and in the second area it is different from the first. This second area can be larger superficially and also completely cover the first area. If the first liquid is for example an etching liquid, it can be removed without residue from the surface facing the mask using the second liquid (for example, deionized water). At the same time the mask can also be cleaned or liquid can be removed from it.

BRIEF DESCRIPTION OF THE INVENTION

Other details, features, and advantages of the invention result from the following description of the embodiments of the invention shown in the drawings.

FIGS. 1–5 schematically show axial sections 5 of different embodiments as claimed in the invention.

Figure 6:
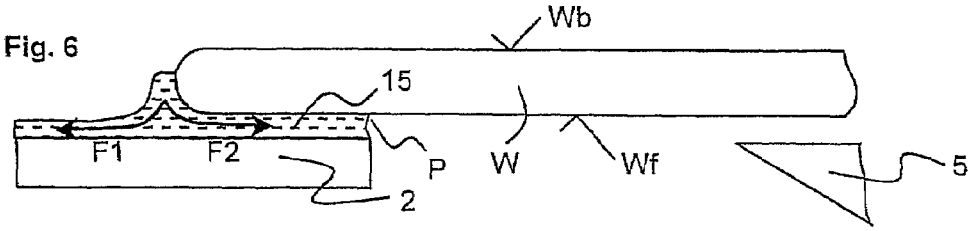
Figure 7:
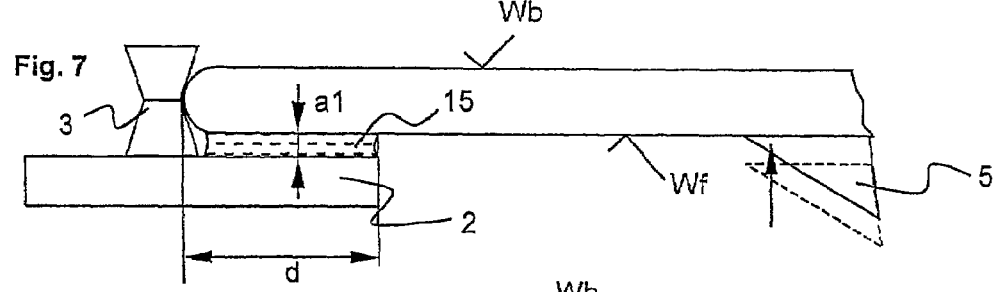
Figure 8:
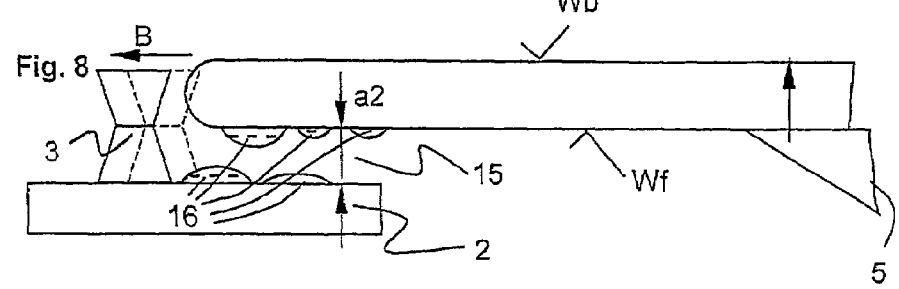

FIGS. 6–8 show a schematic axial section of an embodiment as shown in FIG. 1 in different operating states.

DESCRIPTION OF THE PREFERRED EMBODIMENTS

FIG. 1 shows one embodiment of the device 1 of the invention. The device 1 consists of an essentially round base body 4 to which the mask 2 which here has the shape of a ring is concentrically attached. But the ring 2 can also be machined out of the base body. The ring 2 has an outside diameter which is larger and an inside diameter which is smaller than the outside diameter of the wafer. Pins 3 which are mounted on the ring 2 hold the wafer W on the peripheral side. The pins 3 have a notch 31 which locks into the wafer edge and thus keep the wafer in a defined horizontal position. The pins 3 with their notches 31 represent the spacer means to the mask 2. Between the mask 2 and the wafer surface Wf a defined gap 15 is thus established. The pins 3 are moved via a mechanism which is not shown relative to an axis A in order to grip the wafer securely and to remove or to lift the wafer to release it again. Within the base body 4 there is a lifting mechanism 5 (distance changing means) which can be moved up and down in the direction L of the arrow, and can change the distance between the wafer W and the mask 2. The lifting mechanism consists of a carrier which has an essentially plane surface which is parallel to the wafer, which faces the wafer and which, when the carrier is lifted, touches the wafer only on its lower surface Wf and then lifts the wafer. The entire device 1 and with it the wafer can rotate around the wafer axis A.

The treatment liquid can be applied either by the nozzle 7 which is mounted outside in the vicinity of the wafer edge or by a nozzle 6 which is pointed against the wafer surface Wb facing away from the mask 2. In the first case (nozzle 7) an amount 20 of liquid is applied directly to the mask 2 near the wafer edge. The liquid is then pulled in by the capillary-like gap 15 and thus precisely wets the area of the wafer surface Wf which is assigned to the mask 2 and which is overlapped by it. In the second case (nozzle 6) an amount 18 of liquid is applied to the surface Wf facing away from the mask 2, for example in its center, the liquid runs then radially to the outside to the wafer edge; this can be supported by rotation of the wafer. Thereupon the liquid flows around the wafer edge and is pulled in by the gap 15. In both cases the wafer can rotate during the entire liquid treatment (R); this has the advantage that excess liquid which does not penetrate into the gap 15 cannot flow down uncontrolled over the mask 2, but is flung off in a controlled manner. Then a second liquid (for example, deionized water) is applied to the wafer surface Wf facing the mask 2 via the liquid line 28, at the same time the carrier 4 rotates, by which the second liquid displaces the liquid which is located in the gap 15. At the same time, before or even afterwards the wafer is lifted with the lifting mechanism 5.

FIG. 2 shows another embodiment. The mask 2 (ring) is supported by the disk 8. The wafer W is held by a rotating vacuum chuck 13 on its surface Wb facing away from the mask. This has the advantage that neither the wafer edge nor the wafer surface Wf facing the mask are touched. Both the chuck 13 holding the wafer W and also the mask 2 can be turned around the same axis A, the chuck in direction Rw and the mask in direction Rm. If this takes place with the same rotational speed and in the same direction, the mask and the wafer are not moved relative to one another (Rw=Rm). The chuck 13 and the mask 2 are connected to one another via the distance changing means 5 and are moved by it away from and towards one another (arrow L). This distance changing means 5 can be for example a pneumatic cylinder or a spindle. Using this distance changing means 5 the gap 15 between the wafer and mask can be set exactly, therefore it represents a spacer means at the same time. The nozzle 7 applies an amount 20 of liquid directly to the mask 2 near the wafer edge. The liquid is then pulled in by the capillary-like gap 15.

FIG. 3 shows a third embodiment. The device 1 consists of a bath tank 27 in which there is a pot-shaped carrier 14. The space 23 within the carrier is sealed against the bath 26 which is located between the carrier and bath tank. The carrier 14 can be lifted from the bath 26 using the lifting mechanism. The upper edge of the carrier has the shape of a ring 2 which represents the mask, with a surface which faces the wafer W and which is plane-parallel to its surfaces Wf. On this ring 2 (mask) there are pins 3 with notches which keep the wafer at a defined distance to the mask, by which a gap 15 forms. The carrier 14 with the wafer W located on it is lowered into the bath (L1) so far that the liquid level is located somewhat above the ring so that the wafer edge is wetted. The liquid is pulled by capillary forces into the gap 15 between the wafer and mask. To prevent the penetration of liquid into the space 23 within the carrier as a result of the negative pressure in it, the space is connected via the tube 25 to the environment. A slight overpressure can also be built up via this tube 25 in the space 23 within the carrier, and the carrier is again lifted out of the bath (L1). After liquid treatment, the liquid located in the gap 15 is forced radially to the outside using the stronger overpressure which has been built up by a gas which has been supplied through the tube 25. The gap 15 can also be enlarged with the distance changing means 5. Here four pins 5 which can move up and down are shown; they can touch the wafer within the mask 2 on its surface assigned to the mask and can lift it vertically (L2).

FIG. 4 shows a fourth embodiment. The device consists of a bath 14 in which the treatment liquid is located and which can be moved up and down (arrow L1), and of a carrier 11. The carrier 11 consists of a base body 4 and a ring 2 which is molded on underneath. Pins 3 with notches which are made underneath on the ring 2 hold the wafer W on the peripheral side, at a defined gap distance to the ring 2 so that the wafer in the horizontal position is suspended underneath on the carrier. The carrier 11 together with the wafer W is immersed into the bath tank 27 so far that the liquid level wets the ring 2 and thus the surface Wb of the wafer facing away from the ring and the peripheral-side wafer edge are completely wetted. The liquid penetrates into the gap between the wafer and ring. The carrier 11 is lifted out of the bath after treatment. A vacuum-pickup 5 which is mounted within the carrier is moved down so that it touches and suctions the wafer on the surface Wf of the wafer facing the mask. Afterwards the wafer is moved farther down with the pickup and thus the capillary force, by which the liquid is held within the gap 15, is overcome. By rotating the pickup the liquid residue remaining on the wafer may be flung off.

Figure 5:
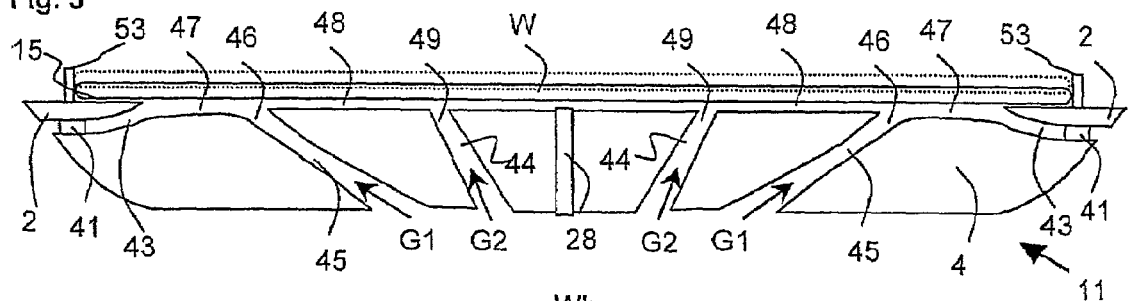

FIG. 5 shows one embodiment. The device consists of a carrier 11 which [has] a base body 4, and of a ring 2 which is attached via spacers 41 at a distance to the base body on the latter. The ring is over the spacer parts 41. On the ring 2 pins 53 are attached which, referenced to the axis of rotation A of the carrier 11, can be moved radially to the outside and can surround the wafer W on the peripheral side. The pins 53 have the shape of a small cylinder with their axes perpendicular to the surface of the wafer. Gas channels 44 and 45 are machined into the base body 4 and they discharge into gas nozzles 46 and 49 against which the surface of the wafer facing the carrier 11 is pointed. The nozzles 46 and 49 are positioned obliquely to the outside, the nozzles 49 lying farther to the inside being positioned less obliquely than the nozzles 46 which lie farther to the outside, i.e. the emerging gas flow G1 of the nozzles 46 which lie farther to the outside strikes the wafer surface at a flatter angle than the emerging gas flow G2 of the nozzles which lie farther to the inside. The distance of the base body 4 to the wafer W in the area 48 between the inner and outer nozzles 49 and 46 is smaller than in the area 47 outside the outer nozzles 46. Both the nozzles 49 which lie to the inside and also the nozzles 46 which lie to the outside can be selectively either a plurality of nozzles arranged in a circle, or can have the shape of annular nozzles.

This device can be operated in essentially two different ways. In the first operating mode the outer gas flow G1 and the inner gas flow G2 can be turned on and off separately from one another. If only the first gas flow G1 is turned on, the gas flows only over the area 47. The wafer W is only slightly lifted, by which a small capillary-like gap 15 forms between the mask 2 and the wafer W. If in this first operating state a liquid, as is described in the description to FIG. 1, is applied, it is pulled into the gap 15. If at this point, in addition or instead of the gas flow G1, the gas flow G2 is turned on, gas flows not only over the area 47 outside of the outer nozzles 46, but also over the area 48 between the outer and inner nozzles. By means of this second operating state the wafer W is lifted somewhat, shown by the dotted line. The wafer edge slides along the cylinder surface of the pins 53. This slight lifting of the wafer is enough for the liquid in the gap 15 between the mask and wafer to no longer be held by the capillary forces. The liquid can be removed from this area; this takes place by the gas flow, i.e. the droplets are blown away radially to the outside. Removal of the liquid can be supported by the entire carrier 11 and with it the wafer rotating. In addition, by means of a nozzle which is supplied by the liquid line 28, flushing liquid can be routed through the base body 4 to the wafer surface facing the carrier, by which the liquid in the gap 15 is additionally displaced. This flushing liquid must for its part of course also be removed again.

In the second operating mode the two gas flows G1 and G2 are jointly connected. In the first operating state less gas flows than in the second operating state, by which the wafer in the second operating state assumes a position in which its distance to the mask 2 is larger than in the first operating state. The distance of the wafer W to the mask 2 in the first operating state is for example 0.5 mm and in the second 0.8 mm.

Using FIGS. 5–8 the operating mode of a device as claimed in the invention will be described, proceeding from the embodiment of FIG. 1. First of all, the wafer W is moved into the vicinity of the mask 2, by which the gap 15 forms. The defined distance between the mask 2 and the wafer is ensured by spacer means, here the pins 3 (FIG. 6) with notches. At this point liquid is applied either to the wafer surface Wb facing away from the mask or directly to the wafer edge. The liquid in part enters the gap 15 (F2). The excess part of the liquid F1 runs down and is thrown off when the mask and/or the wafer rotate. The liquid cannot run farther to the inside than the inner contour of the mask 2, i.e. it penetrates only to the point P. The distance a1 between the mask 2 and the wafer is chosen to be so small that the liquid is held by capillary forces within the gap 15, and treats the wafer surface there. A lifting mechanism 5 now comes into contact with the wafer surface Wf which faces the mask 2, the pins 3 are now opened (B) and the lifting mechanism 5 lifts the wafer such that the liquid film in the gap 15 tears and only more drops 16 remain on the mask and/or on the wafer surface. These drops 16 can now be rinsed off, blown off and/or flung off.

The invention claimed is:
1. Device for liquid treatment of a defined section of a wafer-shaped article (W), especially of a wafer, comprising:
   holding means for holding the wafer-shaped article;
   a mask which in shape and size corresponds to the area of the defined section which is to be treated with liquid;
   spacer means which keep the mask and the wafer-shaped article at a defined short distance to one another such that liquid can be retained between the mask and the defined area of the wafer-shaped article by capillary forces; and
   distance changing means set to increase a distance between the mask and the wafer-shaped article from a first distance at which capillary forces hold liquid between the mask and the wafer-shaped article to a greater, second releasing distance determined to overcome the capillary forces holding the liquid, to overcome the capillary forces and release the liquid from between the mask and the wafer-shaped article,
   said distance changing means comprising a base body (4) and two sets of gas nozzles (46, 49) discharging from the base body against the surface of the wafer-shaped article,
   the two sets of gas nozzles positioned differentially with respect to an outside of the base body, a first set of the nozzles (49) being positioned at a first angle and a second set of the nozzles (46) being positioned at a second angle so that an emerging gas flow (G1) of the second set of nozzles strikes the wafer-shaped article's surface at a different angle than an emerging gas flow

(G2) of the first set of nozzles, the first angle and second angle being different.

2. Device as claimed in claim 1, wherein the mask (2) has the shape of a ring.

3. Device as claimed in claim 2, wherein the ring has an inside diameter which is less than the outside diameter of the wafer-shaped article, and an outside diameter which is at least the same size as the outside diameter of the wafer-shaped article.

4. Device as claimed in claim 1, wherein the spacer means keep the mask and the wafer-shaped article at a distance (a1) of 0.05 to 1 mm.

5. Device as claimed in claim 1, wherein the spacer means comprises gripper elements (3, 53) which are in direct contact with the wafer-shaped article and are joined directly or indirectly to the mask (2).

6. Device as claimed in claim 1, wherein the mask and holding means are stationary relative to one another with respect to rotation around an axis (A) which is perpendicular to the mask.

7. Device as claimed in claim 1, wherein the spacer means comprises a gas feed means (45, 46) which is joined directly or indirectly (41) to the mask (2) and is pointed against the wafer-shaped article, by which the wafer-shaped article can be kept on a gas cushion.

8. Device as claimed in claim 1, wherein the distance changing means is separated from the spacer means.

9. Device as claimed in claim 8, wherein the distance changing means are made such that they can change the distance between the mask and the wafer-shaped article during or immediately after the liquid treatment.

10. Device as claimed in claim 1, wherein the elements of the spacer means are at the same time elements of the distance changing means.

11. Device as claimed in claim 10, wherein the two sets of nozzles comprise a gas feed means (44, 49) which is joined directly or indirectly to the mask (2) and is pointed against the main surface (Wf) of the wafer-shaped article, by which the wafer-shaped article can be kept on a gas cushion.

12. Device as claimed in claim 1, with guide elements (3, 53) which border the position of the wafer-shaped article on the peripheral side and which are located essentially perpendicular to the main surface of the wafer-shaped article.

13. Device as claimed in claim 12, wherein the holding means comprises guide elements (53) and a gas feed means (45, 46).

14. Device as claimed in claim 1, wherein the spacer means and the distance changing means are essentially the same gas feed means (44, 45, 46, 49), and there are means by which the gas feed means can be shifted into at least two different operating states, by which two different distances between the wafer-shaped article and the mask can be adjusted.

15. Device as claimed in claim 1, wherein the holding means can be caused to rotate (R).

16. Device as claimed in claim 1, with a liquid line (28) which is pointed at the surface of the wafer-shaped article facing the mask.

17. Device as claimed in claim 1, wherein the distance changing means is a means for varying the distance between the mask and the wafer-shaped article from the first distance to the second releasing distance in order to overcome the capillary forces and release the liquid from between the mask and the wafer-shaped article.

18. The device of claim 1, wherein the first set of the nozzles (49) are lying interior to the second set of the nozzles (46).

19. The device of claim 18, wherein the first set of the nozzles (49) are positioned less obliquely than the second set of nozzles so that an emerging gas flow (G1) of the second set of nozzles strikes the wafer-shaped article's surface at a flatter angle than an emerging gas flow (G2) of the first set of nozzles.

20. The device of claim 1, wherein the first set of the nozzles (49) are positioned less obliquely than the second set of nozzles so that an emerging gas flow (G1) of the second set of nozzles strikes the wafer-shaped article's surface at a flatter angle than an emerging gas flow (G2) of the first set of nozzles.

21. Device for liquid treatment of a defined section of a wafer-shaped article (W), especially of a wafer, comprising:
holding means for holding the wafer-shaped article;
a mask which in shape and size corresponds to the area of the defined section which is to be treated with liquid; and
spacer means which keep the mask and the wafer-shaped article at a defined short distance to one another such that liquid can be retained between the mask and the defined area of the wafer-shaped article by capillary forces,
wherein the device is free of any gas feed means for gas flushing of the surface of the wafer-shaped article facing the mask.

22. Device as claimed in claim 21, wherein the mask (2) has the shape of a ring.

23. Device as claimed in claim 22, wherein the ring has an inside diameter which is less than the outside diameter of the wafer-shaped article, and an outside diameter which is at least the same size as the outside diameter of the wafer-shaped article.

24. Device as claimed in claim 22, wherein the spacer means keep the mask and the wafer-shaped article at a distance (al) of 0.05 to 1 mm.

25. Device as claimed in claim 22, wherein the spacer means comprises gripper elements (3, 53) which are in direct contact with the wafer-shaped article and are joined directly or indirectly to the mask (2).

26. Device as claimed in claim 22, wherein the mask and holding means are stationary relative to one another with respect to rotation around an axis (A) which is perpendicular to the mask.

27. Device as claimed in claim 22, wherein the distance changing means is separated from the spacer means.

28. Device as claimed in claim 27, wherein the distance changing means are made such that they can change the distance between the mask and the wafer-shaped article during or immediately after the liquid treatment.

29. Device as claimed in claim 22, wherein the elements of the spacer means are at the same time elements of the distance changing means.

30. Device as claimed in claim 22, with guide elements (3, 53) which border the position of the wafer-shaped article on the peripheral side and which are located essentially perpendicular to the main surface of the wafer-shaped article.

31. Device as claimed in claim 22, wherein the holding means can be caused to rotate (R).

32. Device as claimed in claim 22, with a liquid line (28) which is pointed at the surface of the wafer-shaped article facing the mask.

* * * * *